US010097148B2

(12) United States Patent
Ishihara

(10) Patent No.: US 10,097,148 B2
(45) Date of Patent: Oct. 9, 2018

(54) POWER AMPLIFICATION MODULE

(71) Applicant: Murata Manufacturing Co., Ltd., Kyoto (JP)

(72) Inventor: Shota Ishihara, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/451,702

(22) Filed: Mar. 7, 2017

(65) Prior Publication Data

US 2017/0179911 A1 Jun. 22, 2017

Related U.S. Application Data

(62) Division of application No. 15/092,395, filed on Apr. 6, 2016, now Pat. No. 9,628,039.

(30) Foreign Application Priority Data

Apr. 30, 2015 (JP) ................................. 2015-092997

(51) Int. Cl.
*H03G 3/30* (2006.01)
*H03F 3/19* (2006.01)
*H03F 1/56* (2006.01)
*H03F 3/21* (2006.01)
*H03F 1/02* (2006.01)
(Continued)

(52) U.S. Cl.
CPC ......... *H03G 3/3042* (2013.01); *H03F 1/0261* (2013.01); *H03F 1/34* (2013.01); *H03F 1/56* (2013.01); *H03F 3/19* (2013.01); *H03F 3/191* (2013.01); *H03F 3/21* (2013.01); *H03F 2200/135* (2013.01); *H03F 2200/222* (2013.01); *H03F 2200/27* (2013.01); *H03F 2200/318* (2013.01); *H03F 2200/324* (2013.01); *H03F 2200/387* (2013.01); *H03F 2200/408* (2013.01); *H03F 2200/451* (2013.01)

(58) Field of Classification Search
USPC .................................. 330/310, 98, 133, 150
See application file for complete search history.

(56) References Cited

U.S. PATENT DOCUMENTS 6,724,252 B2 * 4/2004 Ngo ......................... H03F 3/72
330/129
7,605,651 B2 10/2009 Ripley
8,022,766 B2 9/2011 Dupuis
(Continued)

FOREIGN PATENT DOCUMENTS

JP 2001-028526 A 1/2001
JP 2002-151982 A 5/2002
JP 2008-092521 A 4/2008

*Primary Examiner* — Hieu Nguyen
(74) *Attorney, Agent, or Firm* — Pearne & Gordon LLP

(57) ABSTRACT

Provided is a power amplification module that includes: a first amplification circuit that amplifies a first signal and outputs the amplified first signal as a second signal; a second amplification circuit that amplifies the second signal and outputs the amplified second signal as a third signal; and a feedback circuit that re-inputs/feeds back the second signal outputted from the first amplification circuit to the first amplification circuit as the first signal. The operation of the first amplification circuit is halted and the first signal passes through the feedback circuit and is outputted as the second signal at the time of a low power output mode.

10 Claims, 13 Drawing Sheets

(51) Int. Cl.
*H03F 1/34* (2006.01)
*H03F 3/191* (2006.01)

(56) References Cited

U.S. PATENT DOCUMENTS

| | | |
|---|---|---|
| 2002/0057131 A1 | 5/2002 | Matsushita |
| 2007/0080750 A1 | 4/2007 | Liebenrood |
| 2008/0111630 A1 | 5/2008 | Harima |
| 2014/0184335 A1 | 7/2014 | Nobbe |
| 2015/0295541 A1 | 10/2015 | Hur |

* cited by examiner

10,097,148 B2

POWER AMPLIFICATION MODULE

CROSS REFERENCE TO RELATED APPLICATIONS

This is a division of U.S. patent application Ser. No. 15/092,395, filed on Apr. 6, 2016, entitled "POWER AMPLIFICATION MODULE", which claims priority of Japanese Patent Application 2015-092997, filed on Apr. 30, 2015. The contents of these applications are incorporated by reference herein in their entireties.

BACKGROUND OF THE DISCLOSURE

1. Field of the Disclosure

The present disclosure relates to a power amplification module.

2. Description of the Related Art

A power amplification module is used in a mobile communication device such as a cellular phone in order to amplify the power of a signal to be transmitted to a base station. In such a power amplification module, the gain may be switched in accordance with the output level in order to improve the power addition efficiency. In the power amplification circuit disclosed in Japanese Unexamined Patent Application Publication No. 2002-151982 for example, the gain of the power amplification circuit is adjusted by controlling the bias in accordance with the output level.

Although the gain can be adjusted by controlling the bias, the width of the adjustable range is limited. In recent years, it has been demanded that the gain be further reduced at the time of a low power output mode in power amplification modules that operate in a high power output mode or a low power output mode, and it is difficult to realize such a reduction by controlling only the bias. In addition, a configuration has been considered in which a low power output mode amplification circuit and a high power output mode amplification circuit are provided separately from each other and the signal paths are switched between using a switch in accordance with the power output mode, but the characteristics are degraded by the presence of such a switch along the signal paths.

BRIEF SUMMARY OF THE DISCLOSURE

The present disclosure was made in light of such circumstances and it is an object thereof to reduce the gain at the time of a low power output mode and prevent the degradation of the characteristics in a power amplification module that operates in a high power output mode or a low power output mode.

A power amplification module according to a preferred embodiment of the present disclosure includes: a first amplification circuit that amplifies a first signal and outputs the amplified first signal as a second signal; a second amplification circuit that amplifies the second signal and outputs the amplified second signal as a third signal; and a feedback circuit that re-inputs/feeds back the second signal outputted from the first amplification circuit to the first amplification circuit as the first signal. The operation of the first amplification circuit is halted and the first signal passes through the feedback circuit and is outputted as the second signal at the time of a low power output mode.

According to the preferred embodiment of the present disclosure, it is possible to increase the size of a gain reduction at the time of a low power output mode and suppress the degradation of the characteristics in a power amplification module that operates in a high power output mode or a low power output mode.

Other features, elements, characteristics and advantages of the present disclosure will become more apparent from the following detailed description of the preferred embodiments of the present disclosure with reference to the attached drawings.

DETAILED DESCRIPTION OF THE DISCLOSURE

Figure 1:
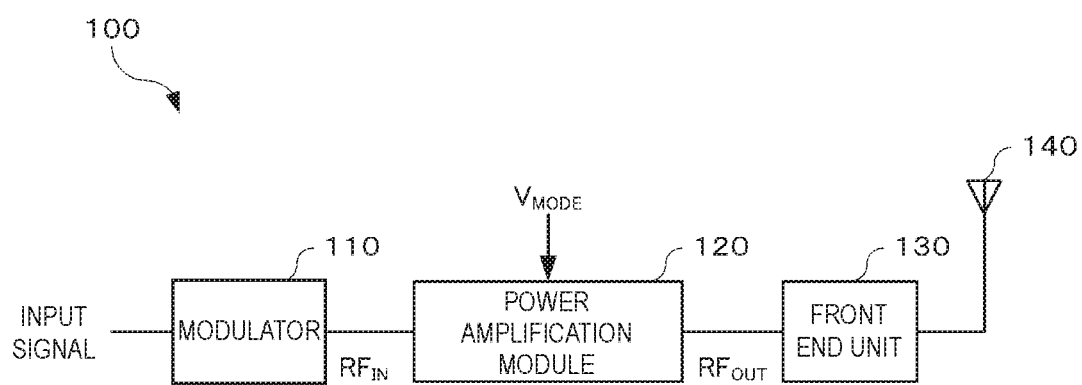
FIG. 1 illustrates an example configuration of a transmission unit that includes a power amplification module according to an embodiment of the present disclosure.

Hereafter, an embodiment of the present disclosure will be described while referring to the drawings. FIG. 1 illustrates an example configuration of a transmission unit that includes a power amplification module according to an embodiment of the present disclosure. A transmission unit 100 is for example used in a mobile communication device such as a cellular phone in order to transmit various signals such as speech and data to a base station. Although such a mobile communication device would also be equipped with a reception unit for receiving signals from the base station, the description of such a reception unit will be omitted here.

As illustrated in FIG. 1, the transmission unit 100 includes a modulator 110, a power amplification module 120, a front end unit 130 and an antenna 140.

The modulator 110 modulates an input signal on the basis of a modulation scheme such as high speed uplink packet access (HSUPA) or long term evolution (LTE) and generates a radio frequency (RF) signal for performing wireless transmission. The RF signal has a frequency of around several hundred MHz to several GHz, for example.

The power amplification module 120 amplifies the power of the RF signal ($RF_{IN}$) outputted from the modulator 110 up to the level that is required to transmit the RF signal to the base station, and outputs the amplified signal ($RF_{OUT}$). The power amplification module 120 operates in a power output mode that corresponds to a power output mode control voltage $V_{MODE}$. The power output mode may be a low power output mode (LPM) or a high power output mode (HPM), for example.

The front end unit 130 filters the amplified signal and switches a reception signal received from the base station. The amplified signal outputted from the front end unit 130 is transmitted to the base station via the antenna 140.

Figure 2:
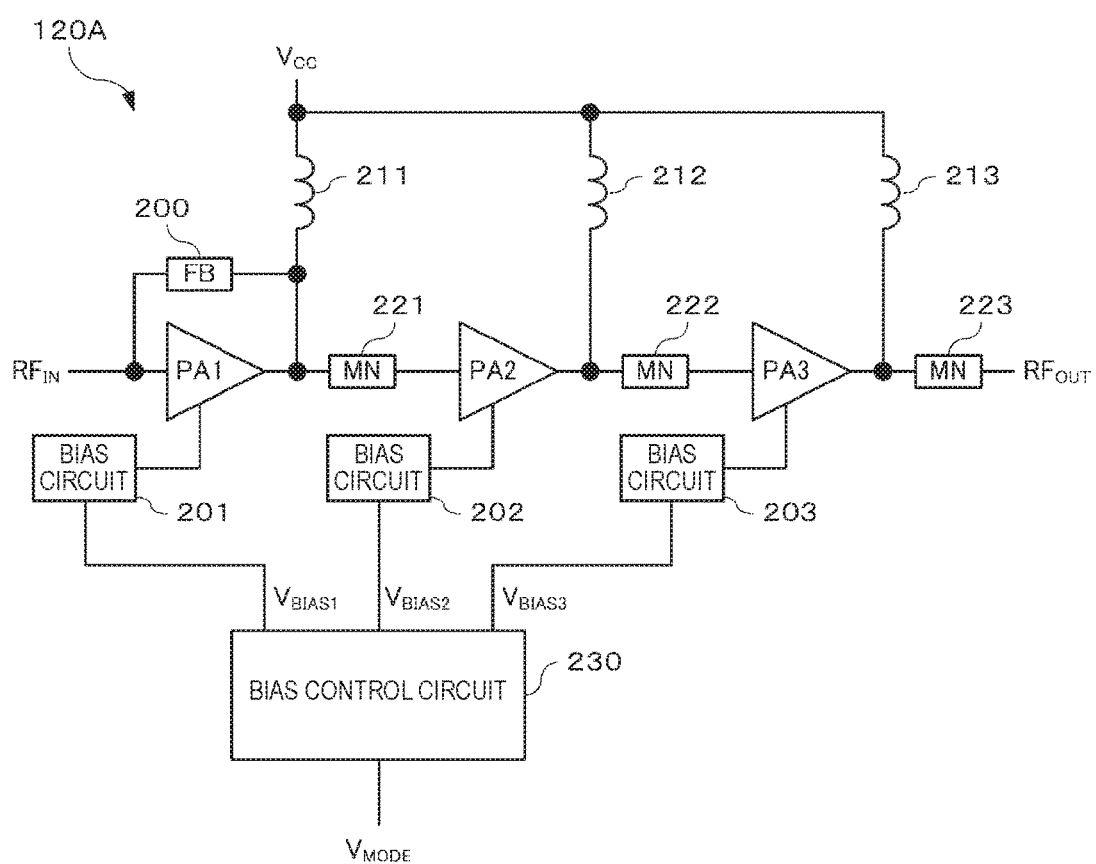
FIG. 2 illustrates an example of the configuration of a power amplification module.

FIG. 2 illustrates an example of the configuration of the power amplification module 120. A power amplification module 120A includes power amplification circuits PA1, PA2 and PA3, a feedback circuit 200, bias circuits 201, 202 and 203, inductors 211, 212 and 213, matching networks (MN) 221, 222 and 223 and a bias control circuit 230.

The power amplification circuits PA1, PA2 and PA3 are circuits that amplify an RF signal and are formed of amplification transistors. The amplification transistors are for example bipolar transistors such as heterojunction bipolar transistors. The power amplification circuits PA1, PA2 and PA3 of the power amplification module 120A form a three-stage amplification circuit. The power amplification circuit PA1 (first amplification circuit) amplifies an input signal (first signal) and outputs the amplified signal (second signal). The power amplification circuit PA2 (second amplification circuit) amplifies the signal from the power amplification circuit PA1 (second signal) and outputs the amplified signal (third signal). The power amplification circuit PA3 (third amplification circuit) amplifies the signal from the power amplification circuit PA2 (third signal) and outputs the amplified signal (fourth signal).

The feedback circuit 200 forms a feedback path from the output (collector) of the power amplification circuit PA1 to the input (base) of the power amplification circuit PA1. The feedback circuit 200 is provided in order to adjust (reduce) the gain of the power amplification circuit PA1.

Figure 3:
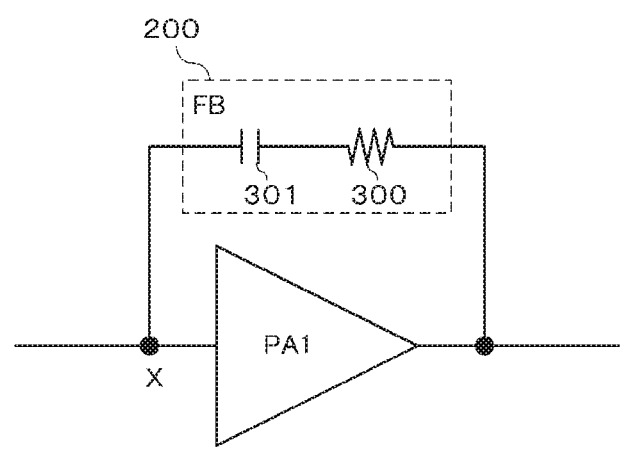
FIG. 3 illustrates an example of a feedback circuit.

FIG. 3 illustrates an example of the feedback circuit 200. As illustrated in FIG. 3, the feedback circuit 200 can be formed of a resistor 300 and a capacitor 301 (CR feedback circuit) connected in series with each other between the output and the input of the power amplification circuit PA1.

The configuration of the feedback circuit 200 illustrated in FIG. 3 is merely an example and the configuration of the feedback circuit 200 is not limited to this configuration. For example, the feedback circuit 200 may instead be formed of a resistor (DC feedback circuit) as described later with reference to FIG. 12. However, since DC feedback is performed in the case where the feedback circuit 200 is formed of a resistor, it is necessary to provide a capacitor that is comparatively large in size around the feedback point (around point X in FIG. 3). Therefore, by adopting the configuration illustrated in FIG. 3 for the feedback circuit 200, an increase in the size of the power amplification module 120A can be suppressed.

The bias circuits 201, 202 and 203 are circuits for supplying bias currents to the power amplification circuits PA1, PA2 and PA3 and each includes a bias circuit transistor. Specifically, in the bias circuit 201 (first bias circuit), a bias control voltage $V_{BIAS1}$ is supplied to the base of the bias circuit transistor and a bias current (first bias current) that corresponds to the bias control voltage $V_{BIAS1}$ is outputted from the emitter of the transistor. The bias current outputted from the bias circuit 201 is supplied to the base of the transistor that forms the power amplification circuit PA1. Similarly, the bias circuit 202 (second bias circuit) outputs a bias current (second bias current) that corresponds to a bias control voltage $V_{BIAS2}$. Furthermore, the bias circuit 203 (third bias circuit) outputs a bias current (third bias current) that corresponds to a bias control voltage $V_{BIAS3}$.

The matching networks 221, 222, 223 are circuits for matching impedances between circuits. The matching networks 221, 222, 223 are formed using capacitors and inductors, for example.

The bias control circuit 230 outputs the bias control voltages $V_{BIAS1}$, $V_{BIAS2}$ and $V_{BIAS3}$ for controlling the bias currents. The bias control voltages $V_{BIAS1}$, $V_{BIAS2}$ and $V_{BIAS3}$ are supplied to the bias circuits 201, 202 and 203, respectively. The bias control circuit 230 controls the bias control voltages $V_{BIAS1}$, $V_{BIAS2}$ and $V_{BIAS3}$ on the basis of the power output mode control voltage $V_{MODE}$.

Specifically, the following settings are made. A voltage at which a transistor forming a bias circuit is switched on is defined as a high level and a voltage lower than this level is defined as a low level. The bias control circuit 230 makes all of the bias control voltages $V_{BIAS1}$, $V_{BIAS2}$ and $V_{BIAS3}$ be at the high level at the time of the high power output mode. In addition, the bias control circuit 230 makes the bias control voltages $V_{BIAS2}$ and $V_{BIAS3}$ be at the high level and makes the bias control voltage $V_{BIAS1}$ be at the low level at the time of the low power output mode.

An example of the operation of the power amplification module 120A will be described.

In the case of the high power output mode, the bias control circuit 230 makes all of the bias control voltages $V_{BIAS1}$, $V_{BIAS2}$ and $V_{BIAS3}$ be at the high level. That is, the bias control circuit 230 supplies the bias currents generated by the bias circuits 201, 202 and 203 to the power amplification circuits PA1, PA2 and PA3, respectively. Thus, in the power amplification module 120A, all the power amplification circuits PA1, PA2 and PA3 operate. Thus, the RF signal ($RF_{IN}$) is amplified by a three-stage amplification circuit constituted by the power amplification circuits PA1, PA2 and PA3.

In the case of the low power output mode, the bias control circuit 230 makes the bias control voltages $V_{BIAS2}$ and $V_{BIAS3}$ be at the high level and makes the bias control voltage $V_{BIAS1}$ be at the low level. In other words, the bias control circuit 230 supplies the bias currents generated by the bias circuits 202 and 203 to the power amplification circuits PA2 and PA3, respectively, and halts the supply of a bias current to the power amplification circuit PA1. Thus, in the power amplification module 120A, the power amplification circuits PA2 and PA3 operate and the power amplification circuit PA1 is halted. Since the power amplification circuit PA1 is halted, the RF signal inputted to the power amplification circuit PA1 passes through the feedback circuit 200 and is outputted to the power amplification circuit PA2. Therefore, the RF signal is amplified by a two-stage amplification circuit constituted by the power amplification circuits PA2 and PA3.

Thus, in the power amplification module 120A, the gain can be made lower in the case of the low power output mode than in the case of the high power output mode since the power amplification circuit PA1 is halted in the low power output mode. By halting the power amplification circuit PA1, the size of the gain reduction achieved at the time of the low power output mode can be made larger than that achieved when the size of the bias current is controlled. In addition, in the power amplification module 120A, since there is no switch along the path of the RF signal, the degradation of the characteristics can be suppressed.

In the power amplification module 120A, it is also possible to make the size of the gain reduction even larger by halting the supply of a bias circuit to some of a plurality of parallel-connected transistors (fingers) that form the power amplification circuit PA3 in the case of the low power output mode. The same applies to other embodiments described below.

In addition, in the power amplification module 120A, a feedback circuit may be provided in the second stage and in the third stage.

Furthermore, although a three-stage amplification circuit has been adopted in the power amplification module 120A, the number of the stages of the amplification circuit is not limited to three, and a two-stage amplification circuit (configuration without power amplification circuit PA3) or an amplification circuit with four or more stages may be adopted.

Figure 4:
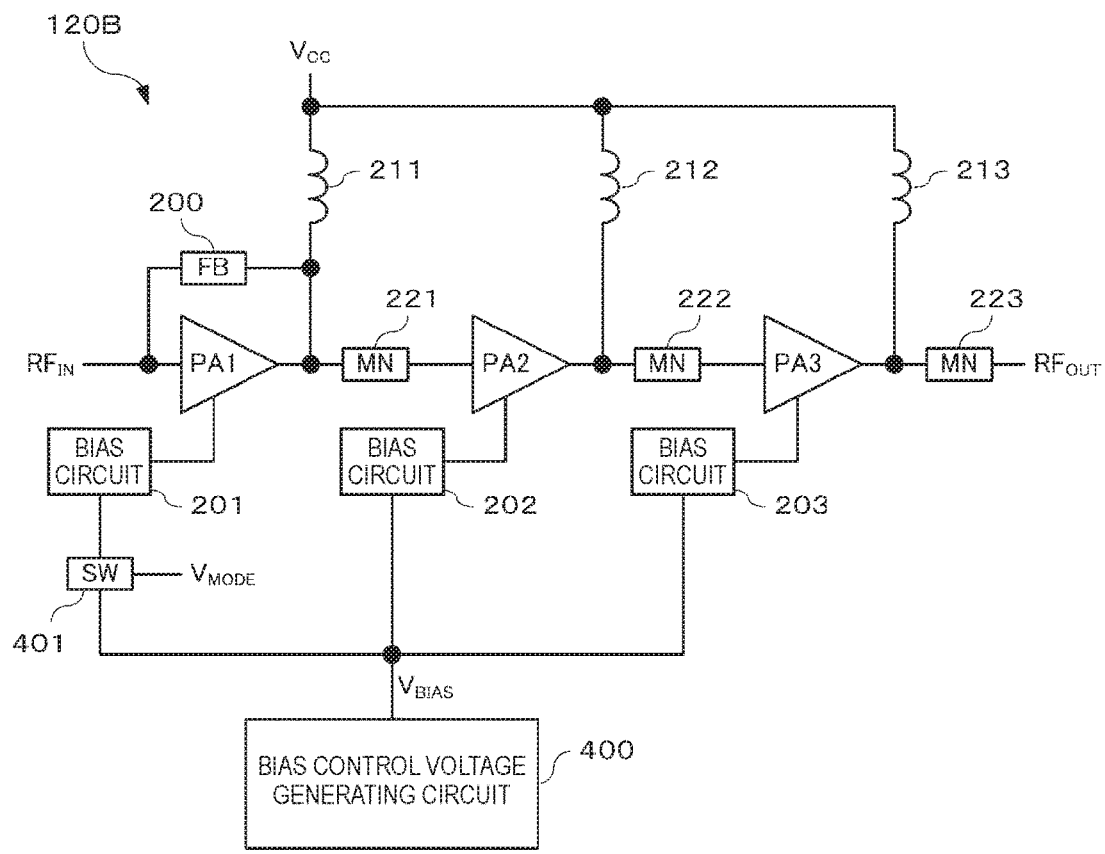
FIG. 4 illustrates another example of the configuration of the power amplification module.

FIG. 4 illustrates another example of the configuration of the power amplification module 120. Constituent elements that are the same as those of the power amplification module 120A illustrated in FIG. 2 are denoted by the same symbols and the description thereof is omitted. As illustrated in FIG. 4, a power amplification module 120B includes a bias control voltage generating circuit 400 and a switch 401 instead of the bias control circuit 230 of the power amplification module 120A.

The bias control voltage generating circuit 400 generates a bias control voltage $V_{BIAS}$ for controlling a bias current. The bias control voltage $V_{BIAS}$ is supplied to the bias circuits 201, 202 and 203. The bias circuits 201, 202 and 203 supply a bias current that corresponds to the bias control voltage $V_{BIAS}$ to the power amplification circuits PA1, PA2 and PA3, respectively.

The switch 401 (bias control circuit) controls the supply of the bias control voltage $V_{BIAS}$ to the bias circuit 201 on the basis of the power output mode control voltage $V_{MODE}$.

Specifically, in the case of the high power output mode, the switch 401 is turned on and the bias control voltage $V_{BIAS}$ is supplied to the bias circuit 201. In addition, in the case of the low power output mode, the switch 401 is turned off and the supply of the bias control voltage $V_{BIAS}$ to the bias circuit 201 is halted. The switch 401 can be formed of a MOSFET, for example. Other switches described later can be similarly formed of a MOSFET, for example.

Since the details of the operation of the power amplification module 120B are the same as those of the operation of the power amplification module 120A, the description thereof is omitted.

Figure 5:
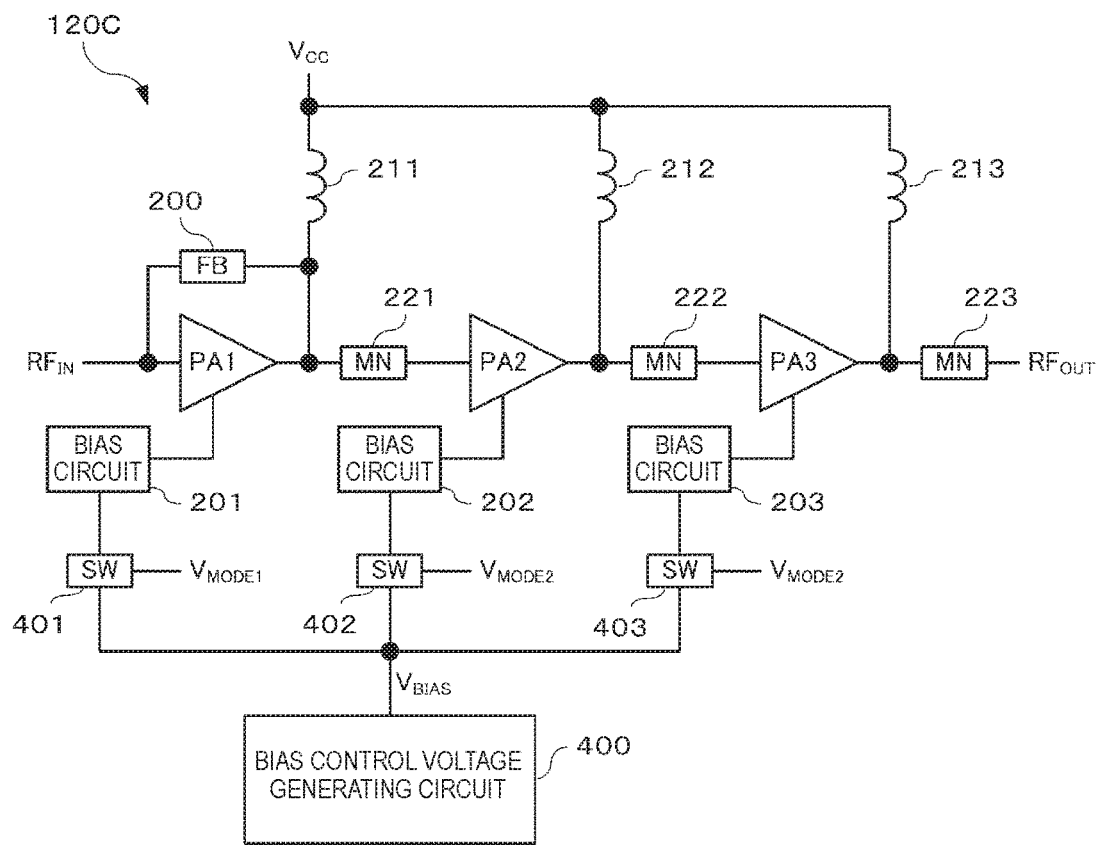
FIG. 5 illustrates another example of the configuration of the power amplification module.

FIG. 5 illustrates another example of the configuration of the power amplification module 120. Constituent elements that are the same as those of the power amplification module 120B illustrated in FIG. 4 are denoted by the same symbols and the description thereof is omitted. As illustrated in FIG. 5, a power amplification module 120C further includes switches 402 and 403 in addition to the configuration of the power amplification module 120B.

The switches 401, 402 and 403 (bias control circuits) respectively control the supply of the bias control voltage $V_{BIAS}$ to the bias circuits 201, 202 and 203 on the basis of power output mode control voltages $V_{MODE1}$ and $V_{MODE2}$.

Specifically, in the case of the high power output mode, the switches 401, 402 and 403 are all turned on. In this case, the bias control voltage $V_{BIAS}$ is supplied to the bias circuits 201, 202 and 203. In addition, in the case of the low power output mode, the switch 401 is turned off and the switches 402 and 403 are turned on. In this case, the supply of the bias control voltage $V_{BIAS}$ to the bias circuit 201 is halted.

Since the details of the operation of the power amplification module 120C are the same as those of the operation of the power amplification module 120A, the description thereof is omitted.

Figure 6:
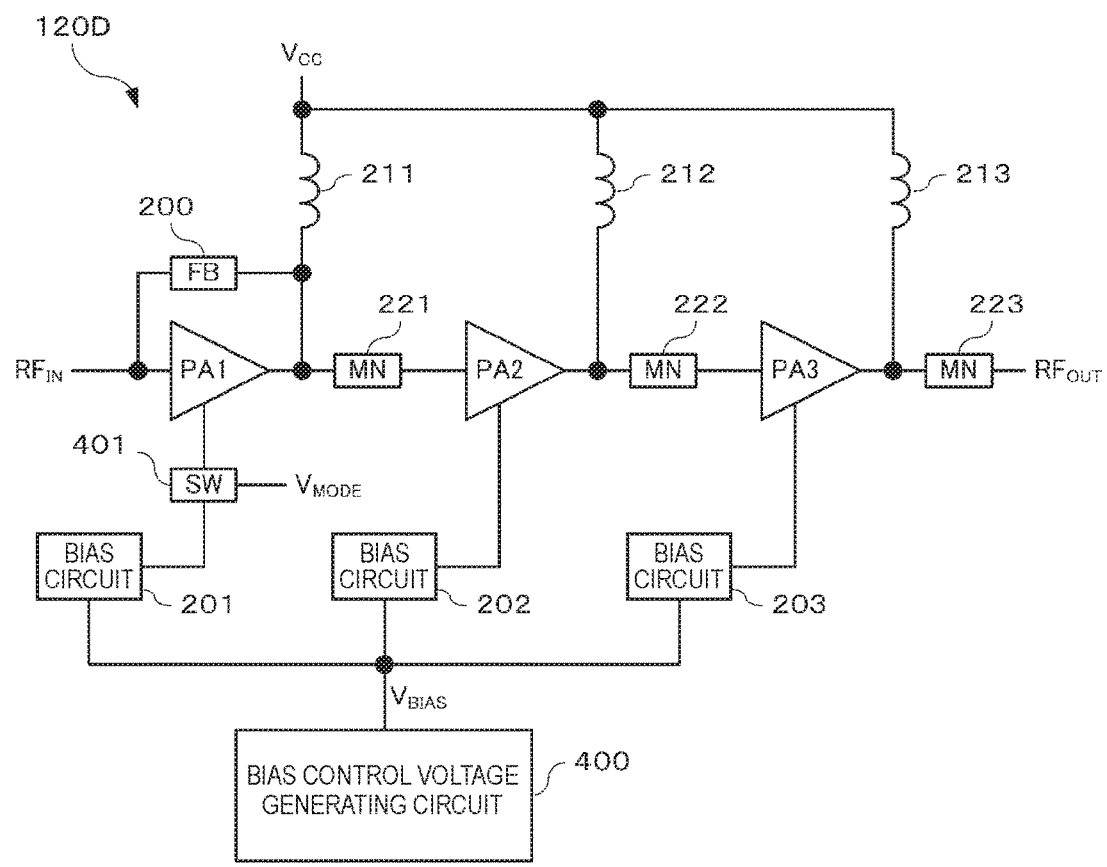
FIG. 6 illustrates another example of the configuration of the power amplification module.

FIG. 6 illustrates another example of the configuration of the power amplification module 120. Constituent elements that are the same as those of the power amplification module 120B illustrated in FIG. 4 are denoted by the same symbols and the description thereof is omitted. As illustrated in FIG. 6, in a power amplification module 120D, the switch 401 controls the supply of a bias current outputted from the bias circuit 201 to the power amplification circuit PA1 on the basis of the power output mode control voltage $V_{MODE}$.

Specifically, in the case of the high power output mode, the switch 401 is turned on. In this case, a bias current is supplied to the power amplification circuits PA1, PA2 and PA3 from the bias circuits 201, 202 and 203, respectively. In addition, in the case of the low power output mode, the switch 401 is turned off. In this case, the supply of the bias current to the power amplification circuit PA1 is halted.

Since the details of the operation of the power amplification module 120D are the same as those of the operation of the power amplification module 120A, the description thereof is omitted.

Figure 7:
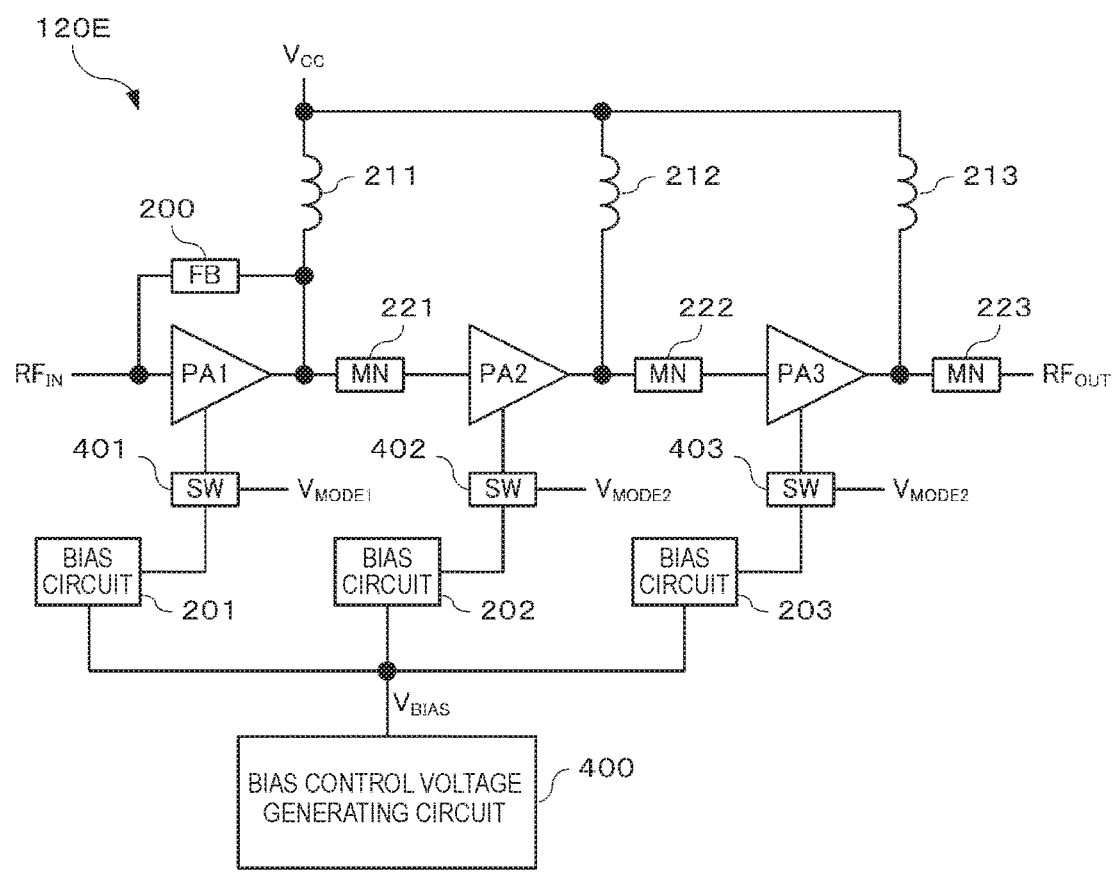
FIG. 7 illustrates another example of the configuration of the power amplification module.

FIG. 7 illustrates another example of the configuration of the power amplification module 120. Constituent elements that are the same as those of the power amplification module 120C illustrated in FIG. 5 or the power amplification module 120D illustrated in FIG. 6 are denoted by the same symbols and the description thereof is omitted.

As illustrated in FIG. 7, in a power amplification module 120E, the switches 401, 402 and 403 (bias control circuits) respectively control the supply of a bias current to the power amplification circuits PA1, PA2 and PA3 on the basis of the power output mode control voltages $V_{MODE1}$ and $V_{MODE2}$.

Specifically, in the case of the high power output mode, the switches 401, 402 and 403 are all turned on. In this case, a bias current is supplied to all of the power amplification circuits PA1, PA2 and PA3. In addition, in the case of the low power output mode, the switch 401 is turned off and the switches 402 and 403 are turned on. In this case, the supply of the bias current to the power amplification circuit PA1 is halted.

Since the details of the operation of the power amplification module 120E are the same as those of the operation of the power amplification module 120A, the description thereof is omitted.

Figure 8:
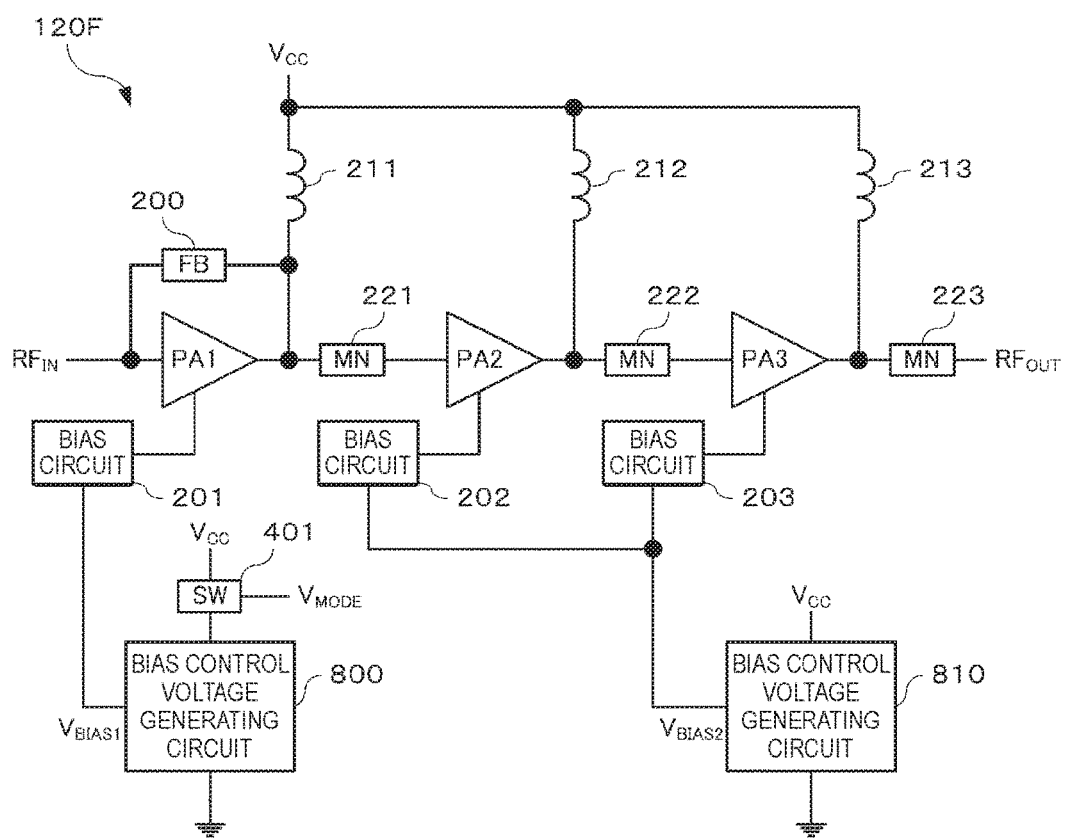
FIG. 8 illustrates another example of the configuration of the power amplification module.

FIG. 8 illustrates another example of the configuration of the power amplification module 120. Constituent elements that are the same as those of the power amplification module 120B illustrated in FIG. 4 are denoted by the same symbols and the description thereof is omitted.

As illustrated in FIG. 8, a power amplification module 120F includes bias control voltage generating circuits 800 and 810 instead of the bias control voltage generating circuit 400 of the power amplification module 120B. The bias control voltage generating circuit 800 generates a bias control voltage $V_{BIAS1}$ to be supplied to the bias circuit 201. The bias control voltage generating circuit 810 generates a bias control voltage $V_{BIAS2}$ to be supplied to the bias circuits 202 and 203. The switch 401 controls the supply of a power supply voltage $V_{CC}$ to the bias control voltage generating circuit 800 on the basis of the power output mode control voltage $V_{MODE}$.

Specifically, in the case of the high power output mode, the switch 401 is turned on. In this case, a bias current is supplied to the power amplification circuits PA1, PA2 and PA3 from the bias circuits 201, 202 and 203, respectively. In addition, in the case of the low power output mode, the switch 401 is turned off. In this case, the operation of the bias control voltage generating circuit 800 is halted and the supply of the bias current to the power amplification circuit PA1 is halted.

Since the details of the operation of the power amplification module 120F are the same as those of the operation of the power amplification module 120A, the description thereof is omitted.

Figure 9:
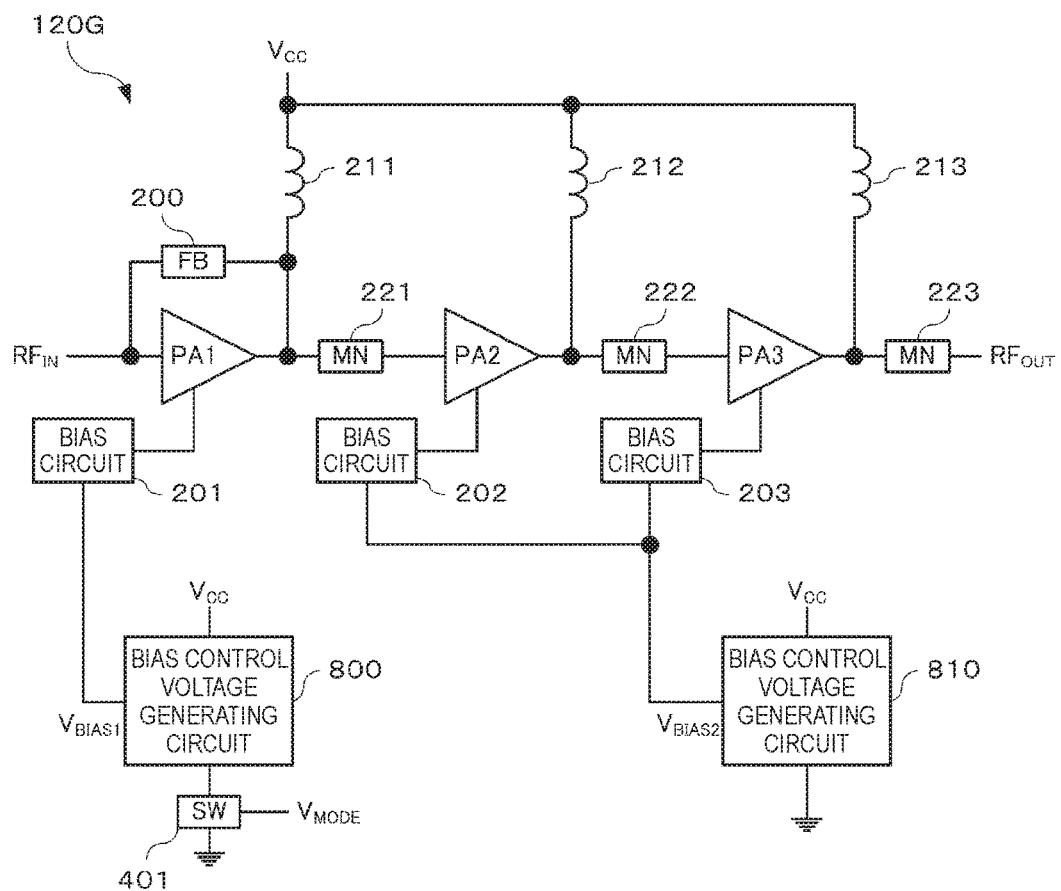
FIG. 9 illustrates another example of the configuration of the power amplification module.

FIG. 9 illustrates another example of the configuration of the power amplification module 120. Constituent elements that are the same as those of the power amplification module 120F illustrated in FIG. 8 are denoted by the same symbols and the description thereof is omitted.

As illustrated in FIG. 9, in a power amplification module 120G, the switch 401 controls the supply of a ground voltage to the bias control voltage generating circuit 800 on the basis of the power output mode control voltage $V_{MODE}$.

Specifically, in the case of the high power output mode, the switch 401 is turned on. In this case, a bias current is supplied to the power amplification circuits PA1, PA2 and PA3 from the bias circuits 201, 202 and 203, respectively. In addition, in the case of the low power output mode, the switch 401 is turned off. In this case, the operation of the bias control voltage generating circuit 800 is halted and the supply of the bias current to the power amplification circuit PA1 is halted.

Since the details of the operation of the power amplification module 120G are the same as those of the operation of the power amplification module 120A, the description thereof is omitted.

Figure 10:
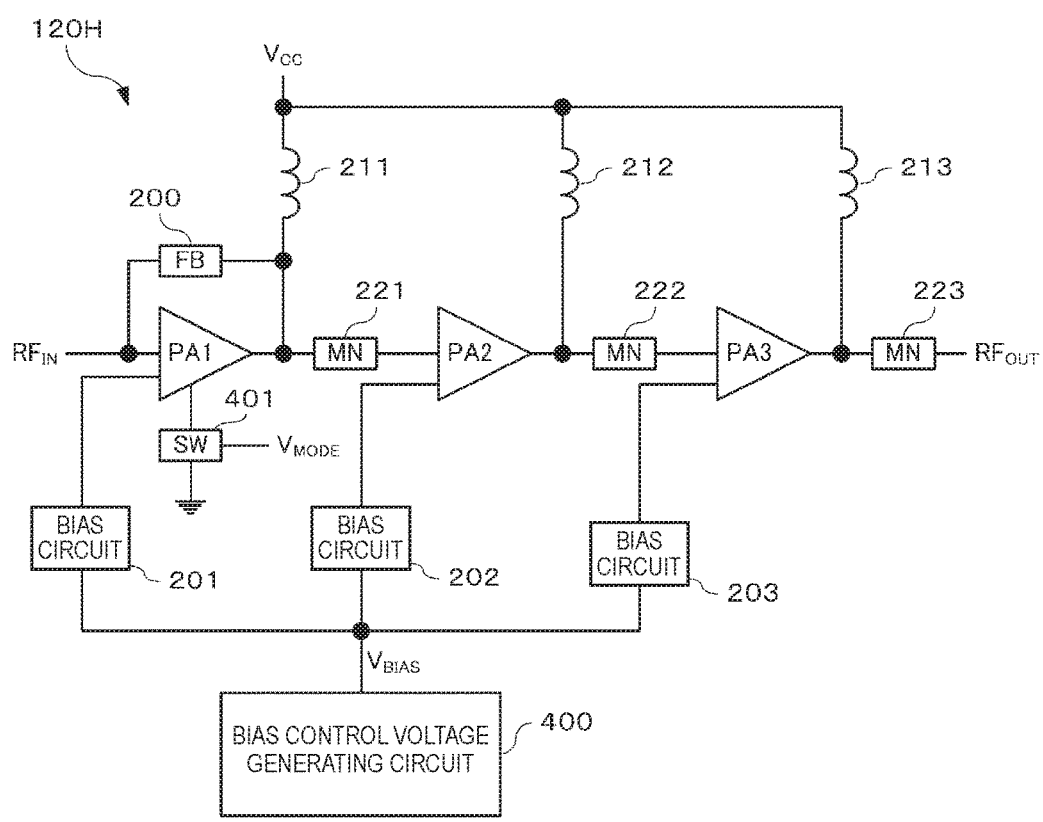
FIG. 10 illustrates another example of the configuration of the power amplification module.

FIG. 10 illustrates another example of the configuration of the power amplification module 120. Constituent elements that are the same as those of the power amplification module 120B illustrated in FIG. 4 are denoted by the same symbols and the description thereof is omitted.

As illustrated in FIG. 10, in a power amplification module 120H, the switch 401 controls the operation of the power amplification circuit PA1 on the basis of the power output mode control voltage $V_{MODE}$. The switch 401 is connected in series with the transistor that forms the power amplification circuit PA1. At the time of the high power output mode, the switch 401 is turned on and therefore the power amplification circuit PA1 operates. On the other hand, at the time of the low power output mode, the switch 401 is turned off and therefore the operation of the power amplification circuit PA1 is halted. Thus, the operation of the power amplification circuit PA1 may be controlled by controlling the supply of a ground voltage or a power supply voltage, rather than by controlling the supply of a bias current.

Since the details of the operation of the power amplification module 120H are the same as those of the operation of the power amplification module 120A, the description thereof is omitted.

Figure 11:
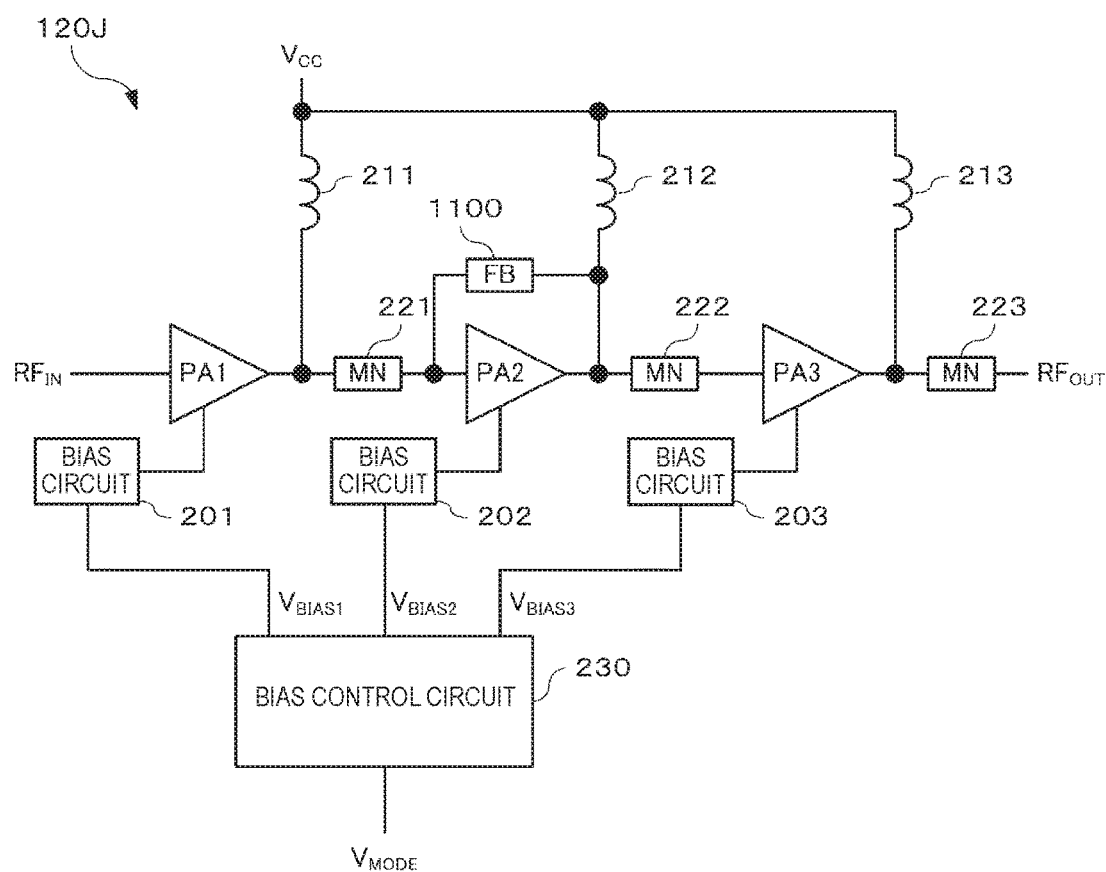
FIG. 11 illustrates another example of the configuration of the power amplification module.

FIG. 11 illustrates another example of the configuration of the power amplification module 120. Constituent elements that are the same as those of the power amplification module 120A illustrated in FIG. 2 are denoted by the same symbols and the description thereof is omitted.

As illustrated in FIG. 11, a power amplification module 120J includes a feedback circuit 1100 instead of the feedback circuit 200 of the power amplification module 120A. The feedback circuit 1100 (second feedback circuit) forms a feedback path from the output (collector) of the power amplification circuit PA2 to the input (base) of the power amplification circuit PA2. The feedback circuit 1100 is provided in order to adjust (reduce) the gain of the power amplification circuit PA2.

Figure 12:
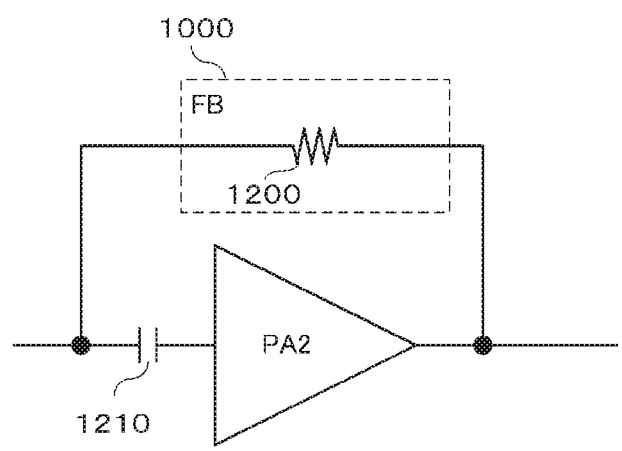
FIG. 12 illustrates an example of a feedback circuit.

FIG. 12 illustrates an example of the feedback circuit 1100. As illustrated in FIG. 12, the feedback circuit 1100 can be formed of a resistor 1200 (DC feedback circuit) connected between the output and the input of the power amplification circuit PA2. A capacitor 1210 can be provided between the input of the power amplification circuit PA2 and the resistor 1200, as illustrated in FIG. 12. The capacitor 1210 may be the part of the matching network 221 or may be provided separate to the matching network 221.

The configuration of the feedback circuit 1100 illustrated in FIG. 12 is merely an example and the configuration of the feedback circuit 1100 is not limited to this configuration. For example, the feedback circuit 1100 can be configured as a CR feedback circuit as illustrated in FIG. 3. However, a DC feedback circuit is stable over a wider frequency band (particularly low frequency band) compared to a CR feedback circuit. Accordingly, by adopting the configuration illustrated in FIG. 12 for the feedback circuit 1100, the characteristics of the power amplification module 120J can be improved.

An example of the operation of the power amplification module 120J will be described.

In the case of the high power output mode, the bias control circuit 230 makes all of the bias control voltages $V_{BIAS1}$, $V_{BIAS2}$ and $V_{BIAS3}$ be at the high level. That is, the bias control circuit 230 supplies the bias currents generated by the bias circuits 201, 202 and 203 to the power amplification circuits PA1, PA2 and PA3, respectively. Accordingly, all the power amplification circuits PA1, PA2 and PA3 operate in the power amplification module 120J. Thus, the RF signal ($RF_{IN}$) is amplified by a three-stage amplification circuit constituted by the power amplification circuits PA1, PA2 and PA3.

In the case of the low power output mode, the bias control circuit 230 makes the bias control voltages $V_{BIAS1}$ and $V_{BIAS3}$ be at the high level and makes the bias control voltage $V_{BIAS2}$ be at the low level. In other words, the bias control circuit 230 supplies the bias currents generated by the bias circuits 201 and 203 to the power amplification circuits PA1 and PA3, respectively, and halts the supply of a bias current to the power amplification circuit PA2. Thus, in the power amplification module 120J, the power amplification circuits PA1 and PA3 operate and the power amplification circuit PA2 is halted. Since the power amplification circuit PA2 is halted, the RF signal inputted to the power amplification circuit PA2 passes through the feedback circuit 1100 and is outputted to the power amplification circuit PA3. Therefore, the RF signal is amplified by a two-stage amplification circuit constituted by the power amplification circuits PA1 and PA3.

Thus, in the power amplification module 120J, the gain can be made lower in the case of the low power output mode than in the case of the high power output mode since the power amplification circuit PA2 is halted in the low power output mode. By halting the power amplification circuit PA2, the size of the gain reduction achieved at the time of the low power output mode can be made larger than that achieved when the size of the bias current is controlled. In addition, in the power amplification module 120J, since there is no switch along the path of the RF signal, the degradation of the characteristics can be suppressed.

Furthermore, in the power amplification module 120J, since the operation of the first stage power amplification circuit PA1, which serves as the input terminal of the RF signal, is not halted at the time of the low power output mode, the input impedance seen by $RF_{IN}$ does not change.

Therefore, the degradation of the voltage standing wave ratio (VSWR) can be suppressed.

In the power amplification module 120J, it is also possible to make the size of the gain reduction even larger by halting the supply of a bias circuit to some of a plurality of parallel-connected transistors (fingers) that form the power amplification circuit PA3 in the case of the low power output mode, similarly to as in the power amplification module 120A. In particular, in the power amplification module 120J, when the operation of the second-stage power amplification circuit PA2 is halted, the gain peak shifts toward the low-frequency side, but the input capacitance of the third-stage power amplification circuit PA3 is reduced and the gain peak can be returned toward the high-frequency side by halting the operation of the part of the third-stage power amplification circuit PA3.

Furthermore, in the power amplification module 120J, a feedback circuit may be provided in the first stage and in the third stage.

Furthermore, although a three-stage amplification circuit has been adopted in the power amplification module 120J, the number of the stages of the amplification circuit is not limited to three, and a two-stage amplification circuit (configuration without power amplification circuit PA3) or an amplification circuit with four or more stages may be adopted. In addition, the supply of a bias current can also be controlled using a switch, similarly to as in the power amplification modules 120B to 120G.

Figure 13:
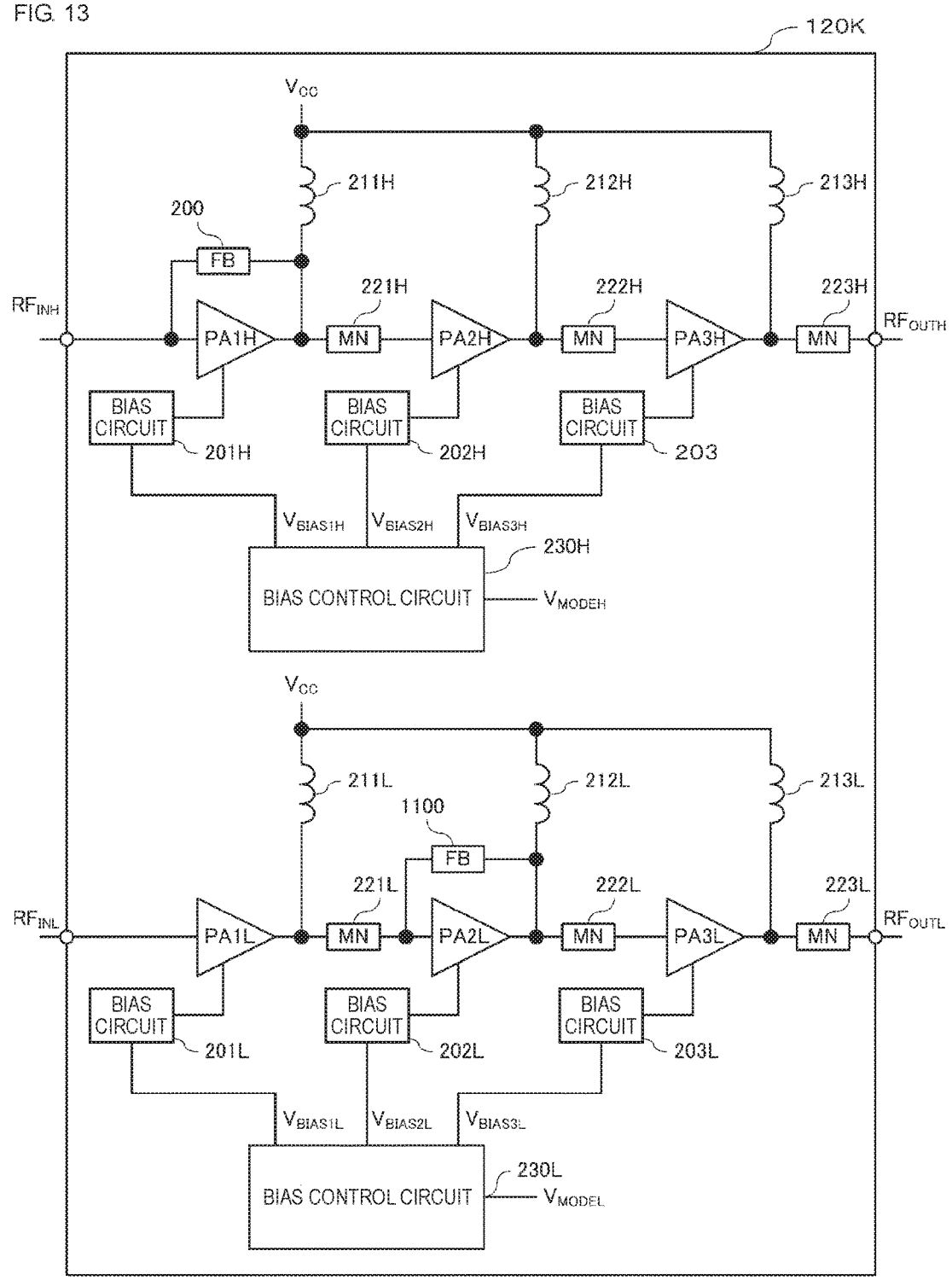
FIG. 13 illustrates another example of the configuration of the power amplification module.

FIG. 13 illustrates another example of the configuration of the power amplification module 120. Constituent elements that are the same as those of the power amplification module 120A illustrated in FIG. 2 or the power amplification module 120J illustrated in FIG. 11 are denoted by the same symbols and the description thereof is omitted.

A power amplification module 120K includes a circuit for amplifying an RF signal ($RF_{INH}$) of a comparatively high frequency band (first frequency band) and a circuit for amplifying an RF signal ($RF_{INL}$) of a comparatively low frequency band (second frequency band).

In the power amplification module 120K, the high-frequency-band RF signal ($RF_{INH}$) is amplified using a configuration that is the same as the power amplification module 120A illustrated in FIG. 2. Specifically, a bias control circuit 230H (first bias control circuit) controls bias control voltages $V_{BIAS1H}$, $V_{BIAS2H}$ and $V_{BIAS3H}$ on the basis of a power output mode control voltage $V_{MODEH}$ such that a power amplification circuit PA1H (first amplification circuit), a power amplification circuit PA2H (second amplification circuit) and a power amplification circuit PA3H (third power amplification circuit) all operate in the case of the high power output mode. In addition, the bias control circuit 230H controls the bias control voltages $V_{BIAS1H}$, $V_{BIAS2H}$ and $V_{BIAS3H}$ on the basis of the power output mode control voltage $V_{MODEH}$ such that the operation of the power amplification circuit PA1H is halted and the RF signal $RF_{INH}$ is outputted to the power amplification circuit PA2H via the feedback circuit 200 (first feedback circuit) in the case of the low power output mode.

In the power amplification module 120K, the low-frequency-band RF signal ($RF_{INL}$) is amplified using a configuration that is the same as the power amplification module 120J illustrated in FIG. 11. Specifically, a bias control circuit 230L (second bias control circuit) controls bias control voltages $V_{BIAS1L}$, $V_{BIAS2L}$ and $V_{BIAS3L}$ on the basis of a power output mode control voltage $V_{MODEL}$ such that a power amplification circuit PA1L (fourth amplification circuit), a power amplification circuit PA2L (fifth amplification circuit) and a power amplification circuit PA3L (sixth power amplification circuit) all operate in the case of the high power output mode. In addition, the bias control circuit 230L controls the bias control voltages $V_{BIAS1L}$, $V_{BIAS2L}$ and $V_{BIAS3L}$ on the basis of the power output mode control voltage $V_{MODEL}$ such that the operation of the power amplification circuit PA2L is halted and an output signal of the power amplification circuit PA1L is outputted to the power amplification circuit PA3L via the feedback circuit 1100 (second feedback circuit) in the case of the low power output mode.

The power amplification module 120K is provided with the high-frequency-band bias control circuit 230H and the low-frequency-band bias control circuit 230L, but a bias control circuit may be commonly used for both the high frequency band and the low frequency band.

In addition, in the power amplification module 120K, it is also possible to make the size of the gain reduction even larger by halting the supply of a bias circuit to some of a plurality of parallel-connected transistors (fingers) that form the power amplification circuits PA3H and PA3L in the case of the low power output mode, similarly to as in the power amplification modules 120A and 120J.

In the power amplification module 120K, the power amplification circuit that stops operating at the time of the low power output mode is the second-stage power amplification circuit PA2L in the low-frequency-band circuit. Therefore, since the first-stage power amplification circuit PA1L does not stop operating at the time of the low power output mode, the degradation of the voltage standing wave ratio can be suppressed.

On the other hand, the power amplification circuit that stops operating at the time of the low power output mode is the first-stage power amplification circuit PA1H in the high-frequency-band circuit. Although it is possible to make the power amplification circuit that stops operating at the time of the low power output mode be the second-stage power amplification circuit PA2H similarly to as in the low-frequency-band circuit, in this case, the gain peak would be shifted toward the low-frequency side when the operation of the power amplification circuit PA2 is halted. The size of a change in the gain peak increases as the frequency becomes higher due to the effect of the impedance of a capacitor ($Z=1/\omega C$) and the impedance of an inductor ($Z=\omega L$). Consequently, by making the power amplification circuit that stops operating at the time of the low power output mode in the high-frequency-band circuit be the first-stage power amplification circuit PA1H rather than the second-stage power amplification circuit PA2H, it is possible to suppress the degradation of the characteristics.

Exemplary embodiments of the present disclosure have been described above. In the power amplification module 120A, the gain can be greatly reduced at the time of the low power output mode by halting the operation of the first-stage power amplification circuit PA1 and causing the RF signal to bypass the first-stage power amplification circuit PA1 via the feedback circuit 200. In addition, since there is no switch along the path of the RF signal, the degradation of the characteristics can be suppressed. The same applies to the power amplification modules 120B to 120G.

Furthermore, by configuring the feedback circuit 200 as a CR feedback circuit in the power amplification module 120A, an increase in the size of the power amplification module 120A can be suppressed compared to the case where the feedback circuit 200 is configured as a DC feedback circuit. This is because in the case of DC feedback, two capacitors are required to prevent a DC voltage from flowing out toward $RF_{in}$ and to prevent a DC voltage from flowing out toward the first-stage power amplification circuit PA1 and since the two capacitors need to let the RF signal pass therethrough, the capacitances of the capacitors need to be large. Consequently, compared with CR feedback, two capacitors having a large capacitance (large in size) need to be used and an increase in the size of the module occurs. In contrast, in the case of CR feedback, no DC voltage returning from the feedback circuit flows toward $RF_{in}$ and therefore the DC voltage can be directly returned to $RF_{in}$. In order to prevent the $RF_{in}$ signal from entering the CR feedback circuit, the capacitance of the capacitor used in CR feedback needs to be made small. As a result, comparing DC feedback and CR feedback, although two capacitors are needed in both types of feedback, the size of the capacitor in the CR feedback can be reduced. It is possible to reduce the size of the power amplifier module 120A.

Furthermore, in the power amplification module 120A, the size of the gain reduction can be increased by halting the operation of some of the transistors (fingers) that form the third-stage power amplification circuit PA3 at the time of the low power output mode.

In addition, in the power amplification module 120J, the gain can be greatly reduced at the time of the low power output mode by halting the operation of the second-stage power amplification circuit PA2 and causing the RF signal to bypass the second-stage power amplification circuit PA2 via the feedback circuit 1100. In addition, since there is no switch along the path of the RF signal, the degradation of the characteristics can be suppressed. Furthermore, since the power amplification circuit that is stopped at the time of the low power output mode is the second-stage power amplification circuit PA2 rather than the first-stage power amplification circuit PA1, the degradation of the voltage standing wave ratio can be suppressed.

In addition, in the power amplification module 120J, the feedback circuit 1100 is configured to perform DC feedback, and therefore the degradation of the characteristics can be suppressed over a wider frequency band than in the case of CR feedback.

Furthermore, in the power amplification module 120A, the size of the gain reduction can be increased by halting the operation of some of the transistors (fingers) that form the third-stage power amplification circuit PA3 at the time of the low power output mode.

In addition, in the power amplification module 120K, by halting the operation of the first-stage power amplification circuit PA1H and causing the RF signal to bypass the first-stage power amplification circuit PA1H via the feedback circuit 200 at the time of the low power output mode in the high-frequency-band circuit, the same effect as in the power amplification module 120A can be obtained. In addition, in the power amplification module 120K, by halting the operation of the second-stage power amplification circuit PA2L and causing the RF signal to bypass the second-stage power amplification circuit PA2L via the feedback circuit 1100 at the time of the low power output mode in the low-frequency-band circuit, the same effect as in the power amplification module 120H can be obtained.

In particular, in the power amplification module 120K, by making the power amplification circuit that stops operating at the time of the low power output mode in the high-frequency-band circuit be the first-stage power amplification circuit PA1H rather than the second-stage power amplification circuit PA2H, it is possible to suppress the degradation of the characteristics.

The embodiments described above are for enabling easy understanding of the present disclosure and are not to be interpreted as limiting the present disclosure. The present disclosure can be modified or improved without departing from the gist of the disclosure and the equivalents to the present disclosure are also included in the present disclosure. In other words, appropriate design modifications made to the embodiments by one skilled in the art are included in the scope of the present disclosure so long as the modifications have the characteristics of the present disclosure. For example, the elements included in the embodiments and the arrangements, materials, conditions, shapes, sizes and so forth of the elements are not limited to those exemplified in the embodiments and can be appropriately modified. In addition, the elements included in the embodiments can be combined as much as technically possible and such combined elements are also included in the scope of the present disclosure so long as the combined elements have the characteristics of the present disclosure.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification module comprising:
   a first amplification circuit amplifying a first signal and outputting the amplified first signal as a second signal;
   a second amplification circuit amplifying the second signal and outputting the amplified second signal as a third signal; and
   a feedback circuit re-inputting and feeding back the second signal outputted from the first amplification circuit to the first amplification circuit as the first signal;
   wherein an operation of the first amplification circuit is halted and the first signal passes through the feedback circuit and is outputted as the second signal at the time of a low power output mode, and
   wherein the feedback circuit is formed of a resistor and a capacitor connected in series with each other.

2. The power amplification module according to claim 1, further comprising:
   a third amplification circuit amplifying the third signal and outputting the amplified third signal as a fourth signal.

3. The power amplification module according to claim 2, wherein the third amplification circuit includes a plurality of transistors connected in parallel with each other, and an operation of some of the plurality of transistors of the third amplification circuit is halted at the time of the low power output mode.

4. The power amplification module according to claim 2, further comprising:
   a third amplification circuit amplifying the third signal and outputting the amplified third signal as a fourth signal.

5. The power amplification module according to claim 4, wherein the third amplification circuit includes a plurality of transistors connected in parallel with each other, and an operation of some of the plurality of transistors of the third amplification circuit is halted at the time of the low power output mode.

6. The power amplification module according to claim 1, further comprising:

a first bias circuit configured to output a bias signal to the first amplification circuit;

a second bias circuit configured to output a bias signal to the second amplification circuit; and a bias control circuit configured to receive a signal corresponding to a power output mode and output a bias control signal to each of the first bias circuit and the second bias circuit in accordance with the power output mode.

7. The power amplification module according to claim 2, further comprising:

a first bias circuit configured to output a first bias signal to the first amplification circuit;

a second bias circuit configured to output a second bias signal to the second amplification circuit;

a third bias circuit configured to output a third bias signal to the third amplification circuit; and a bias control circuit configured to receive a signal corresponding to a power output mode and output a bias control signal to each of the first bias circuit, the second bias circuit, and the third bias circuit in accordance with the power output mode.

8. The power amplification module according to claim 4, further comprising:

a first bias circuit configured to output a first bias signal to the first amplification circuit;

a second bias circuit configured to output a second bias signal to the second amplification circuit;

a third bias circuit configured to output a third bias signal to the third amplification circuit; and a bias control circuit configured to receive a signal corresponding to a power output mode and output a bias control signal to each of the first bias circuit, the second bias circuit, and the third bias circuit in accordance with the power output mode.

9. The power amplification module according to claim 1, wherein the feedback circuit maintains a signal path between an input of the first amplification circuit and an output of the first amplification signal during the low power output mode and during a high power output mode.

10. The power amplification module according to claim 1, wherein the operation of the first amplification circuit is halted by halting a supply of a bias current to the first power amplification circuit.

* * * * *

UNITED STATES PATENT AND TRADEMARK OFFICE
CERTIFICATE OF CORRECTION

PATENT NO. : 10,097,148 B2
APPLICATION NO. : 15/451702
DATED : October 9, 2018
INVENTOR(S) : Shota Ishihara Page 1 of 1

It is certified that error appears in the above-identified patent and that said Letters Patent is hereby corrected as shown below:

In the Claims

Column 12, Line 55, "Claim 2" should be --Claim 1--.

Signed and Sealed this
Twenty-first Day of May, 2019

Andrei Iancu
*Director of the United States Patent and Trademark Office*